US007365378B2

(12) United States Patent
Huang et al.

(10) Patent No.: US 7,365,378 B2
(45) Date of Patent: Apr. 29, 2008

(54) MOSFET STRUCTURE WITH ULTRA-LOW K SPACER

(75) Inventors: Elbert E. Huang, Tarrytown, NY (US); Philip J. Oldiges, Lagrangeville, NY (US); Ghavam G. Shahidi, Pound Ridge, NY (US); Christy S. Tyberg, Mahopac, NY (US); Xinlin Wang, Poughkeepsie, NY (US); Robert L. Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 359 days.

(21) Appl. No.: 11/095,373

(22) Filed: Mar. 31, 2005

(65) Prior Publication Data

US 2006/0220152 A1   Oct. 5, 2006

(51) Int. Cl.
*H01L 29/76* (2006.01)
*H01L 29/94* (2006.01)
*H01L 31/00* (2006.01)

(52) U.S. Cl. ...................... 257/288; 257/408
(58) Field of Classification Search ................ 257/288, 257/327, 346, 394, 410, 408, 635, 637, 639, 257/642, 644
See application file for complete search history.

(56) References Cited

U.S. PATENT DOCUMENTS

| | | | |
|---|---|---|---|
| 5,882,983 A | 3/1999 | Gardner et al. | |
| 5,915,182 A * | 6/1999 | Wu ............................. 438/299 |
| 5,943,585 A | 8/1999 | May et al. | |
| 6,107,667 A | 8/2000 | An et al. | |
| 6,124,177 A * | 9/2000 | Lin et al. ...................... 438/305 |
| 6,124,191 A | 9/2000 | Bohr | |
| 6,177,199 B1 | 1/2001 | Hacker et al. | |
| 6,190,996 B1 * | 2/2001 | Mouli et al. ................. 438/400 |
| 6,194,748 B1 * | 2/2001 | Yu ............................... 257/216 |
| 6,218,020 B1 | 4/2001 | Hacker et al. | |
| 6,348,385 B1 | 2/2002 | Cha et al. | |
| 6,351,013 B1 | 2/2002 | Luning et al. | |
| 6,376,360 B1 | 4/2002 | Cha et al. | |
| 6,406,945 B1 | 6/2002 | Lee et al. | |
| 6,613,637 B1 | 9/2003 | Lee et al. | |
| 6,713,357 B1 | 3/2004 | Wang et al. | |
| 6,720,213 B1 | 4/2004 | Gambino et al. | |
| 6,724,051 B1 | 4/2004 | Woo et al. | |
| 6,737,342 B1 | 5/2004 | Lee et al. | |
| 7,026,689 B2 * | 4/2006 | Liaw ............................ 257/368 |
| 2002/0179982 A1 * | 12/2002 | Cheng et al. ................. 257/401 |
| 2004/0156987 A1 | 8/2004 | Yim et al. | |
| 2004/0253442 A1 | 12/2004 | Mubarekyan et al. | |
| 2005/0023597 A1 * | 2/2005 | Kutsukake et al. ......... 257/315 |

* cited by examiner

*Primary Examiner*—Richard T. Elms
*Assistant Examiner*—Allison P Bernstein
(74) *Attorney, Agent, or Firm*—Gibb & Rahman, LLC (57) ABSTRACT

A MOSFET structure and method of fabricating the structure incorporates a multi-layer sidewall spacer to suppress parasitic overlap capacitance between the gate conductor and the source/drain extensions without degrading drive current and, thereby, effecting overall MOSFET performance. The multi-layer sidewall spacer is formed with a gap layer having a dielectric constant equal to one and a permeable low-K (e.g., less than 3.5) dielectric layer. Alternatively, the multi-layer sidewall spacer is formed with a first L-shaped dielectric layer having a permittivity value of less than approximately three and a second dielectric layer. The multi-layer spacer may also have a third nitride or oxide spacer layer. This third spacer layer provides increased structural integrity.

19 Claims, 11 Drawing Sheets

MOSFET STRUCTURE WITH ULTRA-LOW K SPACER

BACKGROUND OF THE INVENTION

1. Field of the Invention

The invention generally relates to a field effect transistor (FET) structure and, more particularly to a FET structure that incorporates a multi-layer low-K dielectric spacer to suppress capacitance coupling between the gate and the source and drain extensions.

2. Description of the Related Art

The metal-oxide-semiconductor field-effect transistor (MOSFET) is the building block of very large scale integrated (VLSI) circuits in microprocessors and dynamic memories. MOSFETs are four-terminal devices with the terminals designated as the gate conductor, the source and drain regions and the channel. The channel and source and drain regions lie in a substrate on which the gate conductor is positioned. Generally, the channel lies directly beneath the gate conductor with the source and drain regions on either side of the channel. While most of the source and drain regions do not lie beneath the gate, small portions of the source and drain regions referred to as extensions may overlap the gate to enhance MOSFET performance by achieving immunity to short-channel effects. These source and drain extensions may be lightly doped and not as deep as compared to the rest of the source and drain regions. The gate conductor is usually made of a metal or a heavily doped polysilicon and is separated from the channel and the source and drain extensions by a thin oxide film (i.e., gate oxide), such as a silicon dioxide ($SiO_2$) film. Since the gate conductor is electrically insulated from the channel, the channel is capacitively coupled to the gate via the electric field in the gate oxide. The switching speed of the MOSFET is mainly determined by the device drive current and the intrinsic capacitance between the channel and the gate conductor. However, in MOSFET structures in which the gate oxide also overlaps the source and drain extensions, a significant parasitic capacitance is created between the gate conductor and the source and drain extensions. The parasitic capacitance consists of three components: direct overlap capacitance, outer fringe capacitance and inner fringe capacitance. This parasitic capacitance can significantly reduce the MOSFET switching speed and, thereby, can degrade the performance of the MOSFET in alternating current (AC) applications. The invention described below addresses the issue of this parasitic overlap capacitance.

SUMMARY OF THE INVENTION

This disclosure presents embodiments of a field effect transistor structure and a method of forming the structure. Embodiments of the transistor structure and method incorporate a multi-layer low-K dielectric sidewall spacer to suppress capacitance coupling between the gate and the source and drain extensions that extend beneath the gate conductor and gate oxide layer.

One embodiment the transistor structure comprises a multi-layer sidewall spacer with a gap having a permittivity value of one adjacent to a corresponding sidewall and a low-K dielectric layer having a permittivity value of less than three adjacent to the gap layer. The gap may be air, vacuum or gas filled. Another embodiment of the transistor structure comprises a multi-layer sidewall spacer with a first L-shaped low-K dielectric layer adjacent to a corresponding sidewall and a second dielectric layer adjacent to the first dielectric layer. Each of these structural embodiments comprise a substrate with a source extension, a drain extension and a channel region disposed between the source and drain extensions. A gate oxide layer is positioned above the substrate adjacent the channel region and overlapping the source and drain extensions. A gate conductor, having a first sidewall and an opposing second sidewall, is positioned above the gate oxide layer. The multi-layer sidewall spacer is positioned adjacent a gate conductor sidewall and above the source/drain extensions.

In one embodiment of the transistor structure, the multi-layer sidewall spacer comprises a gap layer having a dielectric constant of one and a permeable low-K dielectric layer having a permittivity value of less than three. The gap may be air, vacuum or gas-filled. The gap layer is positioned adjacent the gate sidewall and the permeable low-K dielectric layer is positioned adjacent the gap layer. Both of the layers can be approximately 20 nm thick. The gap layer of the spacer is formed from a heated sacrificial layer. The sacrificial layer comprises an organic material that is thermally stable at temperatures up to about 300° C.-350° C.; however, at temperatures above 400° C., the organic material volatizes into small molecules. Exemplary organic materials can comprise one or a combination of poly(styrenes), poly(esters), poly(methacrylates), poly(acrylates) and poly(glycols), poly(amides), poly(norbornenes), poly(dienes), poly(alkenes), poly(acrylamides), poly(methacrylamides), poly(vinylethers), poly(vinyl alcohols), poly(ketones), poly(acetals), poly(vinylesters), and poly(carbonates) or other materials that are thermally stable to 300-350° C. and thermally degrade at temperatures above 400° C. The permeable low-K dielectric layer is formed adjacent to the organic material. The permeable low-K dielectric layer comprises a permeable low-K dielectric material that has free volume or porosity sufficient to allow diffusion of the small molecules of a volatized organic material. The permeable low-K materials comprise materials containing silicon (Si), and hydrogen (H), and in some cases may contain oxygen (O), nitrogen (N) and or carbon (C), with a free volume or porosity such as organosilicate glass (OSG), organo silsesquioxanes, hydrido-silsesquioxanes, carbon doped oxides, porous silicon oxides, porous silicon nitrides, porous silicon oxynitrides, siloxanes, etc. Materials of this kind are described in U.S. Pat. No. 6,218,020 issued to Hacker et al. on Apr. 17, 2001, incorporated herein by reference and U.S. Pat. No. 6,177,199 issued to Hacker et al. on Jan. 23, 2001, incorporated herein by reference. The permeable low-K layer, thereby, allows for the formation of the gap layer. The multi-layer sidewall spacer can further comprise one or more additional oxide or nitride layers, as needed. The additional spacer layer can protect the permeable low-K dielectric layer from breakdown or erosion during later device fabrication processes and provides increased structural integrity to the gap layer.

In another embodiment of the transistor structure the multi-layer sidewall spacer comprises a first dielectric layer, having a permittivity value of less than three, and a second dielectric layer. The first dielectric layer is L-shaped and comprises a vertical portion positioned adjacent a gate sidewall and a horizontal portion extending away from the sidewall and positioned above the source/drain extension. The second dielectric layer is positioned adjacent the vertical portion and above the horizontal portion of the first dielectric layer. The second dielectric layer comprises either a nitride or an oxide material. Both the first and second dielectric layers can be approximately 20 nm thick. The sidewall spacer can further comprise one or more additional oxide or nitride layers positioned adjacent the second sidewall spacer and the horizontal portion of the first dielectric layer, as needed. In this embodiment of the transistor structure, the first dielectric layer can comprise a material having a permittivity value of less than three. For example, the first dielectric layer can comprise a carbon-doped oxide, a hydrogen-doped oxide, an aromatic polymer, a parylene, a fluorine-doped amorphous carbon, an organosilicate or a Teflon™ material. Alternatively, the first dielectric layer can comprise a dielectric matrix material combined with a pore generating material (i.e., porogen) that is annealed to form a porous spacer having a permittivity value of less than three. For example, the first dielectric layer can comprise an annealed porous oxide, porous silicate, porous organosilicate, or porous SiLK™.

Each embodiment of the method of forming a field effect transistor structure of the present invention comprises first forming a substrate, a gate oxide layer on the substrate and a gate conductor, having a plurality of sidewalls, on the gate oxide layer. The source/drain extensions are implanted into the substrate such that portions of both the source extension and the drain extension extend beneath the gate oxide layer and such that a channel region is created below the gate oxide layer. The channel region is disposed between the source/drain extensions. A sidewall spacer is formed on each of the sidewalls of the gate conductor. Each sidewall spacer is also positioned above a corresponding one of the source/drain extensions in the substrate.

In one embodiment the method of forming a field effect transistor structure, the sidewall spacer is formed such that it comprises an gap layer, having a permittivity value of one, and a permeable low-K dielectric layer, having a permittivity value of less than three. The gap may be air, vacuum or gas filled. To form the gap layer, a sacrificial material is deposited over the gate conductor and the source/drain extensions. The sacrificial material is etched to form a sacrificial layer adjacent to each of the sidewalls of the gate conductor and to expose portions of the each of the source/drain extensions. The sacrificial material can be organic materials such as one or a combination of poly(styrenes), poly(esters), poly(methacrylates), poly(acrylates) and poly(glycols), poly(amides), poly(norbornenes), poly(dienes), poly(alkenes), poly(acrylamides), poly(methacrylamides), poly(vinylethers), poly(vinyl alcohols), poly(ketones), poly(acetals), poly(vinylesters), and poly(carbonates), or other materials that are thermally stable to 300-350° C. but thermally degrade at temperatures above 400° C. Then, the permeable low k dielectric material is deposited (preferably at a temperature not exceeding 350° C.) over the sacrificial layer and etched to form the permeable low-K dielectric layer. The sacrificial layer and the permeable low-K dielectric layer can each be etched to a thickness of approximately 20 nm. The permeable low-K dielectric material may be a material containing silicon (Si), and hydrogen (H), and in some cases may contain oxygen (O), nitrogen (N) and or carbon (C), and should be a material with a free volume or porosity sufficient to allow diffusion of the degradation products of the sacrificial layer. Exemplary permeable low-K dielectric materials include but are not limited to, organosilicate glass, organo silsesquioxanes, hydrido-silsesquioxanes, carbon doped oxides, porous silicon oxides, porous silicon nitrides, porous silicon oxynitrides, and siloxanes. The wafer is then heated (preferably to a temperature above 400° C. for a time period between 1 and 60 minutes). The heating temperature and time should be sufficient to thermally degrade the sacrificial layer and to allow the degradation products to volatilize and diffuse through the permeable low-K dielectric layer to form the gap layer adjacent to the gate stack. Then, either a nitride layer or an oxide layer can be formed over the permeable low-K dielectric layer and any exposed portions of the source/drain extensions. The sacrificial layer, the permeable low-K dielectric material, and the additional dielectric layer can be deposited by spin-apply, chemical vapor deposition, or other appropriate methods.

In another embodiment of the method of forming a field effect transistor structure, a multi-layer sidewall spacer is formed that comprises an L-shaped first dielectric layer, having a permittivity value of less than three. To form the multi-layer spacer a dielectric material is deposited (e.g., either by a chemical vapor deposition technique or a spin-on technique) over the gate conductor and the source/drain extensions. The dielectric material is etched to form the vertical portions of each spacer on either of the sidewalls of the gate conductor and the horizontal portions of each spacer above the source/drain extensions in the substrate. Either a nitride layer or an oxide layer is deposited over the first dielectric layer and then etched to form the second dielectric layer. The first and second dielectric layers each can be etched to a thickness of approximately 20 nm. The first dielectric layer, having a permittivity value of less than three, can be formed by depositing a carbon-doped oxide, a hydrogen-doped oxide, an aromatic polymer, a parylene, a fluorine-doped amorphous carbon, or an organosilicate. Alternatively, the first dielectric layer can be formed by depositing a matrix material (e.g., an oxide, a silicate, an organosiliciate, or an organic material) combined with a pore generating material, etching the deposited material, and then subjecting the deposited material to a rapid thermal anneal process in order to form a porous layer. Such a porous layer can have a permittivity value of less than three and can comprise a porous oxide, a porous silicate, a porous organosilicate, or a porous organic material. The method can further comprise forming a third dielectric layer (e.g., an oxide layer or a nitride layer) adjacent to the second dielectric layer and horizontal portion of the first dielectric layer, as needed.

In each method embodiment, after the spacers are formed additional transistor structure formation processes can be performed such as a implanting the source and drain regions, performing a self-aligned silicide process on the source and drain regions, depositing an insulator layer over the gate conductor, spacer and substrate, etching and filling contact openings, performing a rapid thermal anneal, etc.

Therefore, the embodiments of the field effect transistor structure and method of forming the structure described above incorporates a multi-layer sidewall spacer. In one embodiment, the multi-layer sidewall spacer comprises gap layer with a permittivity value of one adjacent to the gate and a permeable low-K dielectric layer with a permittivity of value of less than three adjacent to the gap layer. In another embodiment, the multi-layer sidewall spacer comprises a first L-shape dielectric layer with a permittivity value of less than three and a second dielectric layer. These multi-layer sidewall spacers of the transistor structures suppress parasitic overlap capacitance between the gate conductor and the source and drain extensions that extend beneath the gate conductor and gate oxide layer without degrading drive current and effecting overall MOSFET performance. These, and other, aspects and objects of the invention will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

This disclosure presents embodiments of a field effect transistor structure and a method of forming the structure. As, stated above, the metal-oxide-semiconductor field-effect transistor (MOSFET) is the building block of very large scale integrated (VLSI) circuits in microprocessors and dynamic memories. MOSFETs are four-terminal devices with the terminals designated as the gate conductor, the source and drain regions and the channel. The channel and source and drain regions lie in a substrate on which the gate conductor is positioned. Generally, the channel lies directly beneath the gate conductor with the source and drain regions on either side of the channel. While most of the source and drain regions do not lie beneath the gate, small portions of the source and drain regions referred to as extensions may overlap the gate to enhance MOSFET performance by achieving immunity to short-channel effects. These source and drain extensions may be lightly doped and not as deep as compared to the rest of the source and drain regions. The gate conductor is usually made of a metal or a heavily doped polysilicon and is separated from the channel and the source and drain extensions by a thin oxide film (i.e., gate oxide), such as a silicon dioxide ($SiO_2$) film. Since the gate conductor is electrically insulated from the channel, the channel is capacitively coupled to the gate via the electric field in the gate oxide. The switching speed of the MOSFET is mainly determined by the device drive current and the intrinsic capacitance between the channel and the gate conductor. However, in MOSFET structures in which the gate oxide also overlaps the source and drain extensions, a significant parasitic capacitance is created between the gate conductor and the source and drain extensions. The parasitic capacitance consists of three components: direct overlap capacitance, outer fringe capacitance and inner fringe capacitance. This parasitic capacitance can significantly reduce the MOSFET switching speed and, thereby, can degrade the performance of the MOSFET in alternating current (AC) applications.

Various attempts have been made to overcome parasitic capacitance. Many of these prior art attempts result in a degradation of drive current and, thereby, a reduction in the overall performance of the MOSFET device. For example, a number of the prior art methods and/or structures reduced parasitic overlap capacitance by reducing the direct overlap region between the source/drain extensions and the gate conductor. However, reducing the direct overlap reduces the drive current and effectively slows down MOSFET devices. It is crucial to find a way to lower the overlap capacitance without degrading device drive current. Other prior art attempts incorporate the use of a spacer with a low dielectric constant. In some instances, the spacer with the low dielectric constant is formed by gate sidewall implantation (e.g., fluorine implantation). However, gate sidewall implantation only reduces the permittivity of the spacer dielectric to within a limited range of approximately 3-4. A permittivity value of between 3 and 4 is not sufficient to effectively reduce the parasitic overlap capacitance. In other instances, the spacer with the low dielectric constant is formed using complex method steps that increase the cost of very large scale integration (VLSI) technology fabrication. The structure and method of the present invention addresses the issue of parasitic overlap capacitance by incorporating a multi-layer gate conductor sidewall spacer comprising a first dielectric layer with a permittivity value of less than three (i.e., an ultra-low K dielectric layer). A second oxide or nitride layer can protect the ultra-low K during later device fabrication processes.

Figure 1:
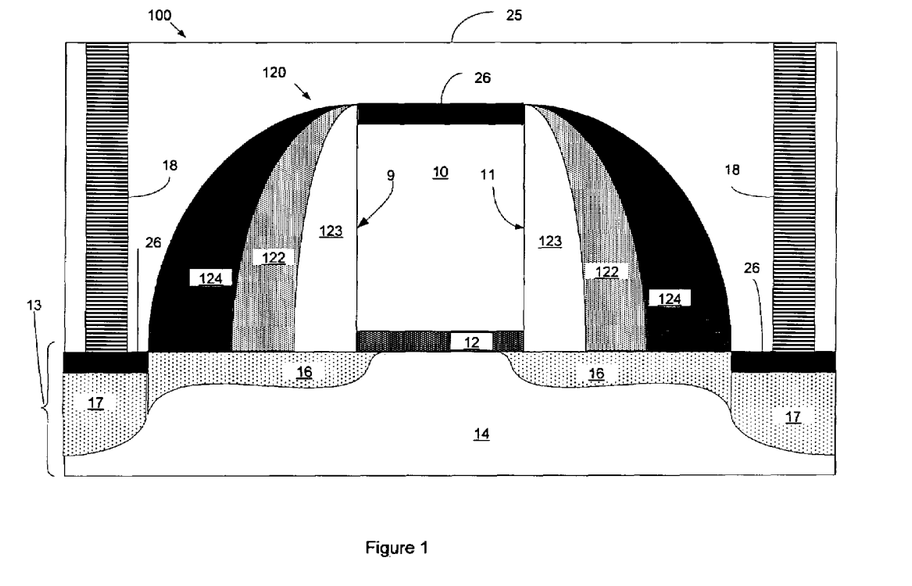
FIG. 1 is a schematic drawing illustrating one embodiment of the present invention.
Figure 2:
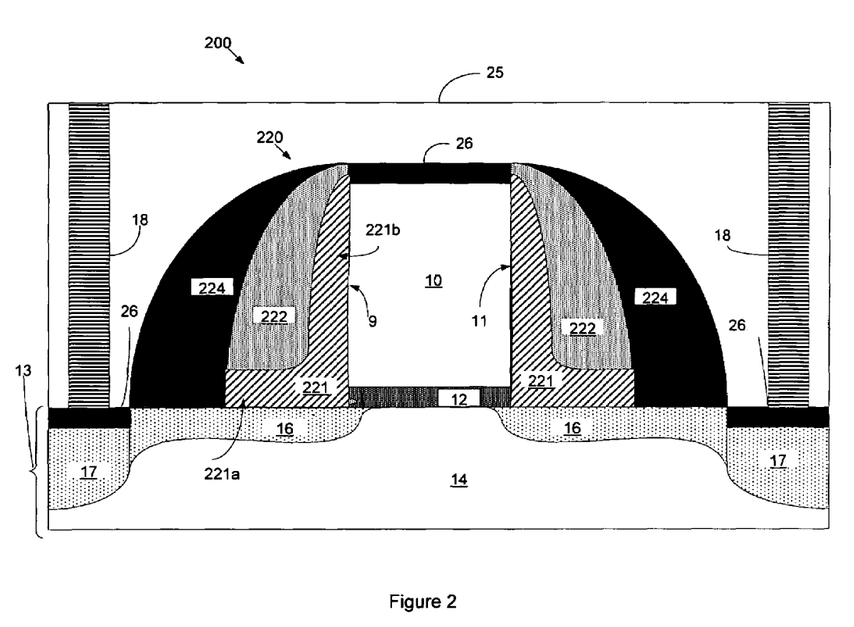
FIG. 2 is a schematic drawing illustrating another embodiment of the present invention.

FIGS. 1-2 illustrate differing embodiments of the structure (100 and 200) of the present invention, each of which incorporates a multi-layer spacer 120, 220 adjacent the gate conductor 10. Each embodiment of the structure 100, 200, comprises a substrate 13 with source and drain extensions 16 and a channel region 14 disposed between the source and drain extensions 16. A gate oxide layer 12 is positioned above the substrate 13 adjacent the channel region 14 and overlapping the source and drain extensions 16. A gate conductor 10, having a plurality of sidewalls (e.g., a first sidewall 9 and an opposing second sidewall 11), is positioned above the gate oxide layer 12. Multi-layer sidewall spacers (120, 220, depending upon the embodiment) are positioned adjacent the gate conductor sidewalls 9, 11 and above the source/drain extensions 16. Source/drain regions 17 are implanted within the substrate 13 respectively adjacent the source/drain extensions 17. Silicides 26 (e.g., $WSi_2$, $TiSi_2$, NiSi or $CoSi_2$) can be implanted on top of the source/drain regions 17 as contacts and on the gate conductor 10 so as to minimize parasitic resistance. An insulator layer 25 can cover the gate conductor 10, the sidewall spacers (120, 220) and the substrate 13. Conductor-filled vias 18 can be formed surrounded by the insulator layer 25 and in contact with the silicide 26 above the source/drain regions 17.

Referring to FIG. 1, in one embodiment of the transistor structure 100, the sidewall spacer 120 comprises a gap layer 123 having a permittivity value of one and a permeable dielectric layer 122 having a permittivity value of less than three i.e., permeable low-K dielectric layer 122). The gap 123 may be air, vacuum or gas-filled. The gap layer 123 is positioned adjacent the gate sidewall 9, 11 and the permeable low-K dielectric layer 122 is positioned adjacent the gap layer 123. Both of the layers 122, 123 can be approximately 20 nm thick. The gap 123 of the spacer 120 is formed from a heated sacrificial layer. The sacrificial layer comprises an organic material that is thermally stable at temperatures up to about 300° C.-350° C.; however, at temperatures above 400° C., the organic material volatizes into small molecules. Exemplary organic materials can comprise one or a combination of poly(styrenes), poly(esters), poly(methacrylates), poly(acrylates) and poly(glycols), poly(amides), poly(norbornenes), poly(dienes), poly(alkenes), poly(acrylamides), poly(methacrylamides), poly(vinylethers), poly(vinyl alcohols), poly(ketones), poly(acetals), poly(vinylesters), and poly(carbonates), or other materials that are thermally stable to 300-350° C. and thermally degrade at temperatures above 400° C. The permeable low-K dielectric layer 122 is formed adjacent to the organic material. The permeable low-K dielectric layer 122 comprises a permeable low-K dielectric material that has free volume or porosity sufficient to allow diffusion of the small molecules of a volatized organic material. The permeable low-K materials comprise materials containing silicon (Si), and hydrogen (H), and in some cases may contain oxygen (O), nitrogen (N) and or carbon (C), with a free volume or porosity such as organosilicate glass (OSG), organo silsesquioxanes, hydrido-silsesquioxanes, carbon doped oxides, porous silicon oxides, porous silicon nitrides, porous silicon oxynitrides, siloxanes, etc. As discussed above, materials of this kind are described in U.S. Pat. No. 6,218,020 issued to Hacker et al. on Apr. 17, 2001, incorporated herein by reference and U.S. Pat. No. 6,177,199 issued to Hacker et al. on Jan. 23, 2001, incorporated herein by reference. The permeable low-K layer 122, thereby, allows for the formation of the gap layer 123. The multi-layer sidewall spacer 120 can further comprise one or more additional oxide or nitride layers 124, as needed. The additional spacer layer 124 can protect the permeable low-K dielectric layer 122 from breakdown or erosion during later device fabrication processes and provides increased structural integrity to the gap layer 123.

Referring to FIG. 2, in another embodiment of the transistor structure 200 the sidewall spacer 220 can comprise a first dielectric layer 221, having a permittivity value of less than three, and a second dielectric layer 222. The first dielectric layer 221 is L-shaped and comprises a vertical portion 221b positioned adjacent a gate sidewall 9, 11 and a horizontal portion 221a extending away from the sidewall 9, 11 and positioned above the source/drain extension 16. The the second dielectric layer 222 does not contact the source/drain extension 16. The second dielectric layer 222 is positioned adjacent the vertical portion 221b and above the horizontal portion 221a of the first dielectric layer 221. The second dielectric layer 222 can comprise an oxide or a nitride material. The second layer 222 protects the ultra-low dielectric first layer 221 from breakdown or erosion during later device fabrication processes. The first and second dielectric layers 221, 222 can both be formed approximately 20 nm thick. Spacer 220 can further comprise one or more additional oxide or nitride layers 224, as needed. The first dielectric layer 221 can comprise a carbon-doped oxide, a hydrogen-doped oxide, an aromatic polymer, a parylene, a fluorine-doped amorphous carbon, an organosilicate or a Teflon™ material. Alternatively, the first dielectric layer 121 can comprise a combination of a dielectric matrix material and a pore generating material (i.e., porogen) that is annealed to form a porous layer having a permittivity value of less than three. For example, the first dielectric layer can comprise an annealed porous oxide, porous silicate, porous organosilicate, or porous SiLK™.

Figure 3:
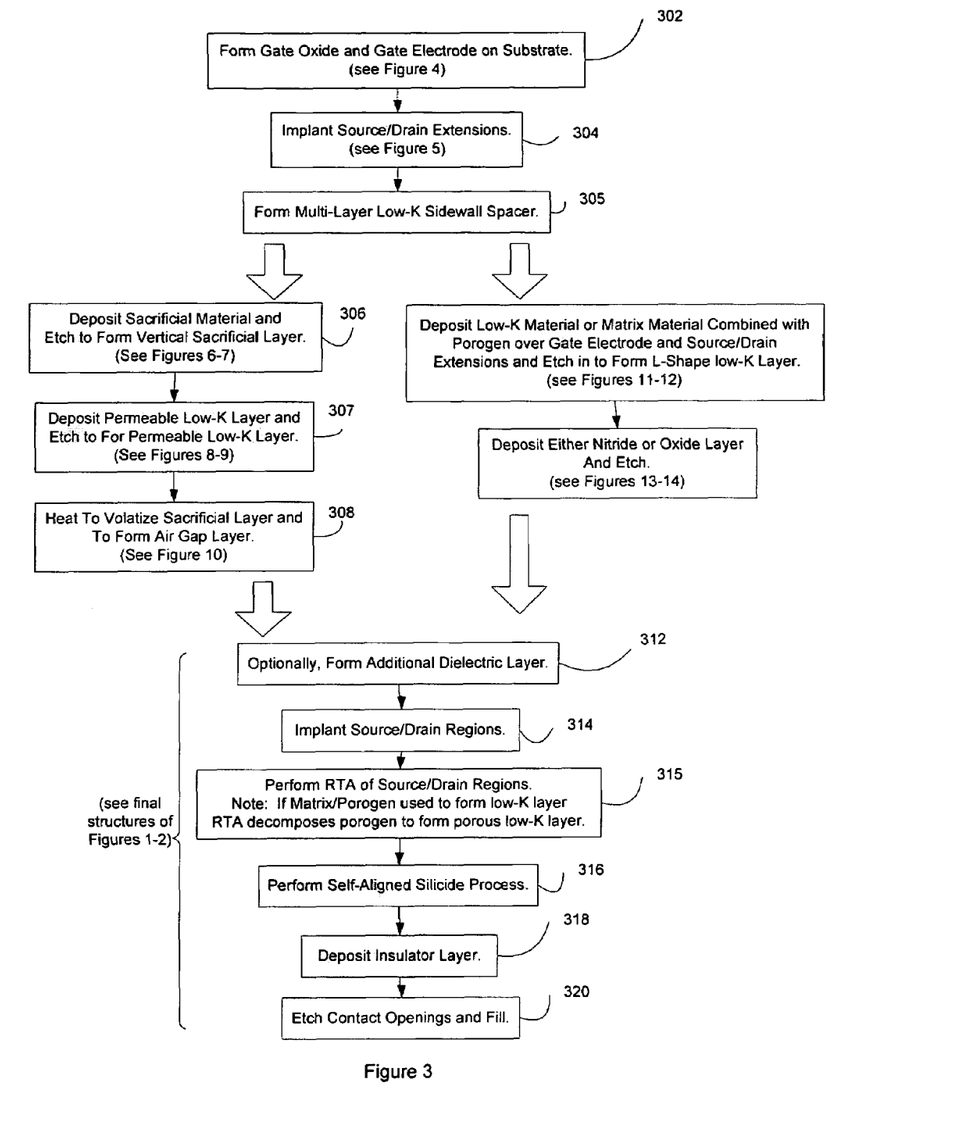
FIG. 3 is a schematic flow diagram of an embodiment of the method of the present invention.
Figure 4:
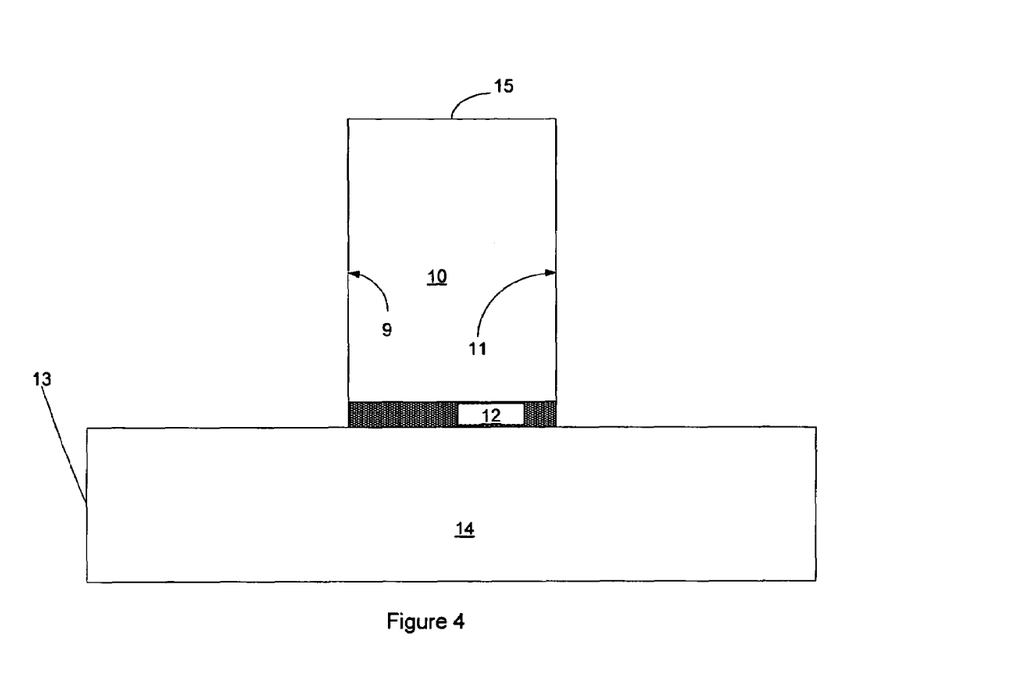
FIG. 4 is a schematic diagram of a partially completed structure of the present invention.
Figure 5:
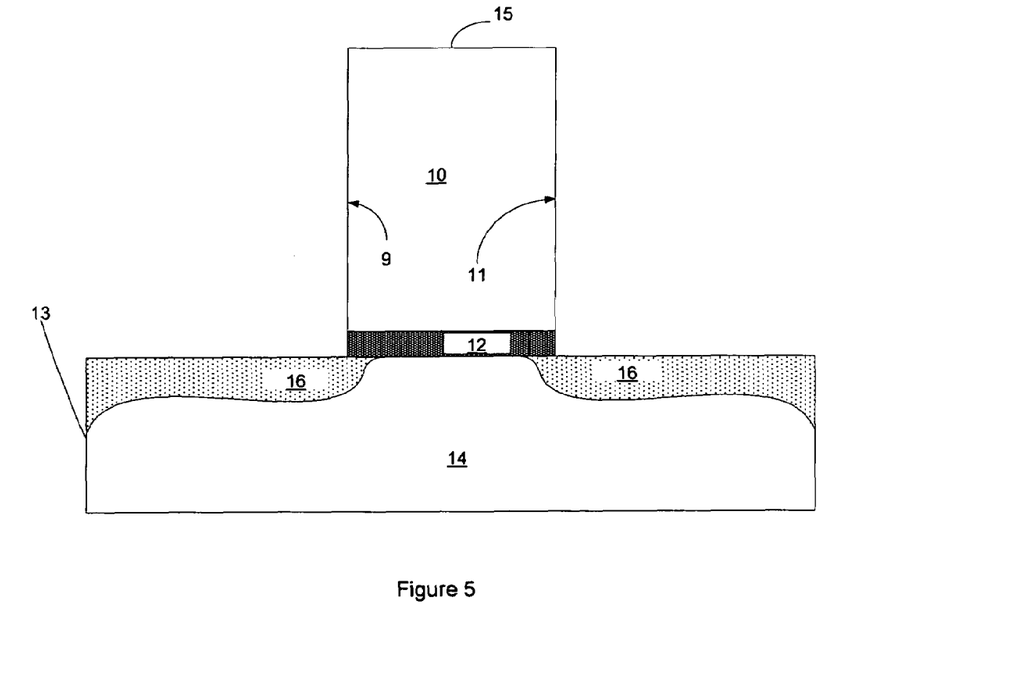
FIG. 5 is a schematic drawing of a partially completed structure of the present invention.

Referring to the flow diagram of FIG. 3, each embodiment of the method of forming a field effect transistor structure (100 of FIGS. 1 and 200 of FIG. 2) comprises using conventional methods for forming a substrate 13, a gate oxide layer 12 on the substrate 13 and a gate conductor 10, having a plurality of sidewalls (e.g., opposing sidewalls 9, 11), on the gate oxide layer 12 (302, see FIG. 4). The substrate 13 can comprise a silicon (e.g., monocrystalline silicon wafer, silicon-on-insulator structure, etc.), slightly doped with n-type or p-typed impurities. The gate oxide layer 12 can be grown or deposited by chemical vapor deposition (CVD). A conductive layer is deposited, patterned and etched to form the gate conductor 10, having a plurality of sidewalls, (e.g. opposing sidewalls 9, 11) and a top surface 15. The lightly doped source/drain extensions 16 are implanted into the substrate 13 such that portions of the source/drain extensions 16 extend beneath the gate oxide layer 12 and such that a channel region 14 is created below the gate oxide layer 12 (304, see FIG. 5). The lightly doped source/drain extensions 16 can be formed by an impurity ion implant and diffusion anneal. The channel region 14 is, thereby, disposed between the source and drain extensions 16. A multi-layered sidewall spacer (120, 220), is formed on each of the sidewalls 9, 11 (305). Each sidewall spacer (120, 220) is formed adjacent a corresponding one of the sidewalls 9, 11 of the gate conductor 10 and above a corresponding one of the source/drain extensions 16 in the substrate 10. Each embodiment of the method of forming a field effect transistor structure of the present invention may also comprise using a sacrificial sidewall spacer scheme as described in U.S. Pat. No. 6,194,748 issued to Yu on Feb. 27, 2001, and incorporated herein by reference. For example, an oxide or nitride sacrificial sidewall spacer may be deposited and then removed, depending upon the embodiment, prior to depositing the sacrificial layer of process 306, discussed below, or prior to depositing the first dielectric layer of process 309, discussed below.

Figure 6:
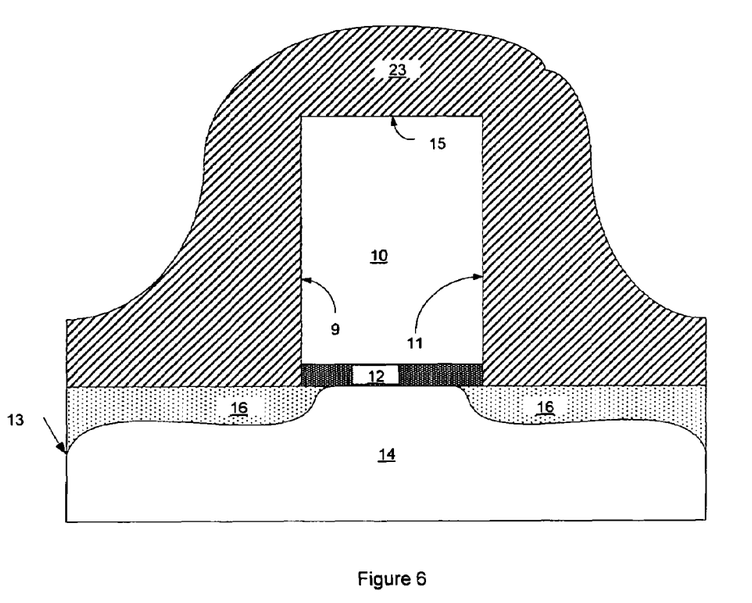
FIG. 6 is a schematic drawing of a partially completed structure of the present invention.
Figure 7:
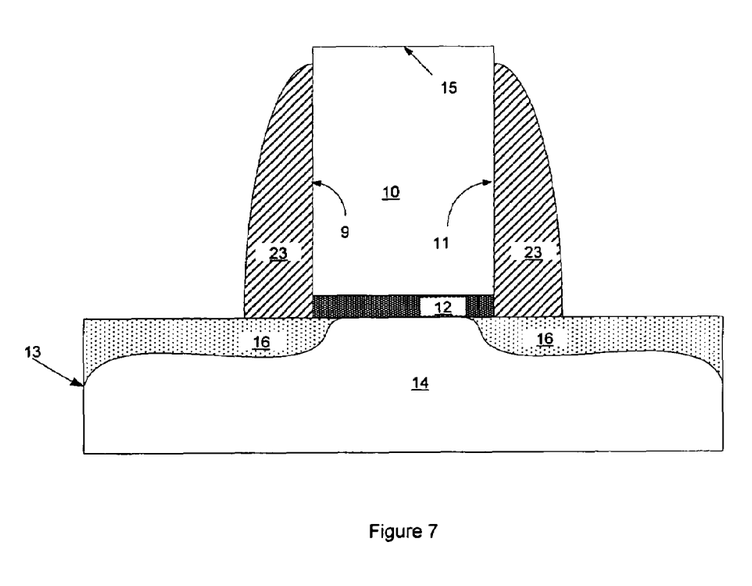
FIG. 7 is a schematic drawing of a partially completed structure of the present invention.
Figure 8:
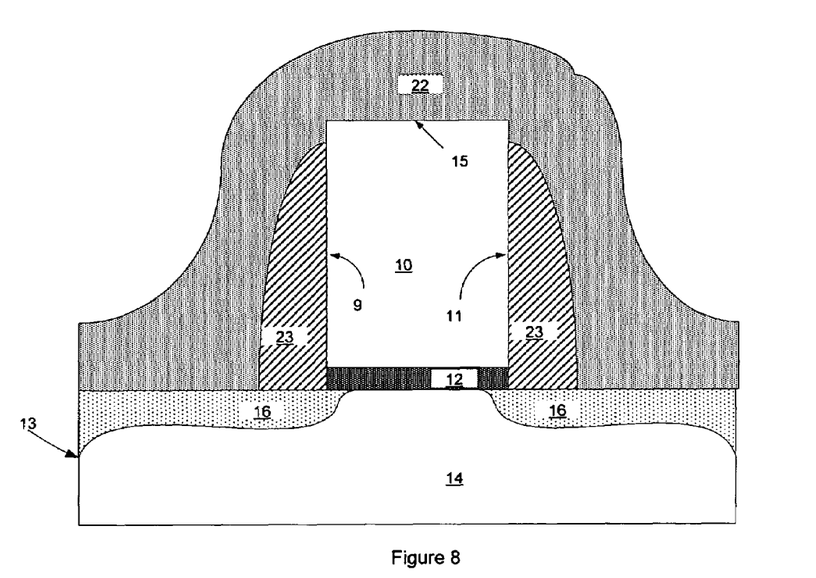
FIG. 8 is a schematic drawing of a partially completed structure of the embodiment of FIG. 1.
Figure 9:
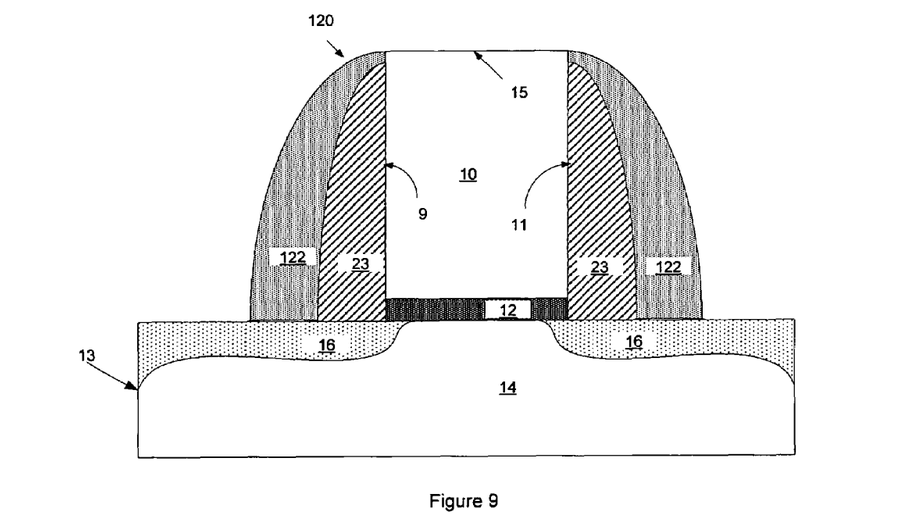
FIG. 9 is a schematic drawing of a partially completed structure of the embodiment of FIG. 2.
Figure 10:
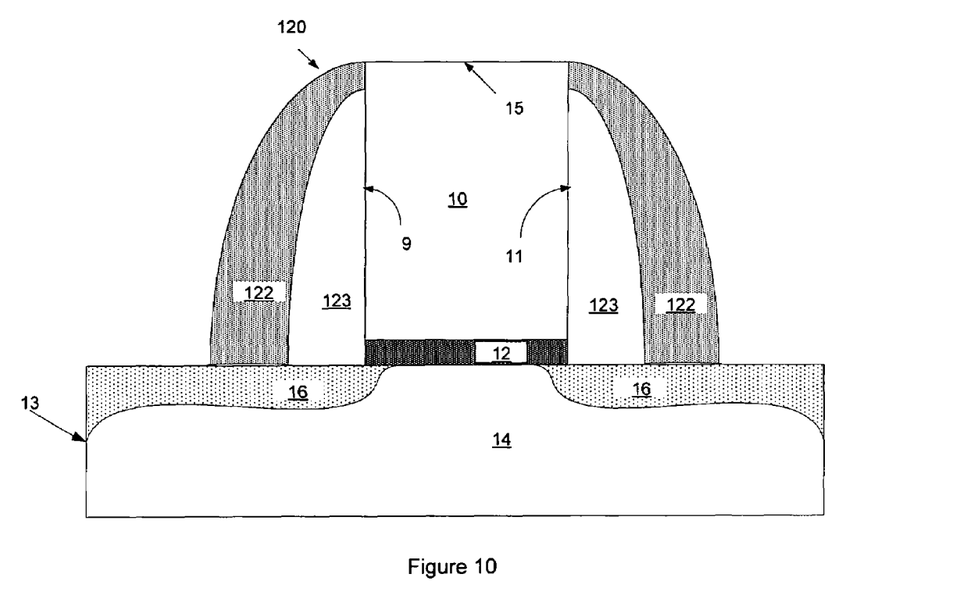
FIG. 10 is a schematic drawing of a partially completed structure of the embodiment of FIG. 3.

Referring to FIG. 3, in one embodiment the method of forming a field effect transistor structure 100 of FIG. 1, the sidewall spacer 120 is formed such that it comprises a gap layer 123, having a permittivity value of one, and a permeable low-K dielectric layer 122, having a permittivity value of less than three. The gap 123 may be air, vacuum or gas-filled. In order to form the gap layer 123 a sacrificial material is deposited over the gate conductor 10 and the source/drain extensions 16 (306, see FIG. 6). The sacrificial material is etched to form a sacrificial layer 23 adjacent to each of the sidewalls 9, 11 of the gate conductor 10 and to expose portions of the each of the source/drain extensions 16 (306, see FIG. 7). The sacrificial material 23 can formed with organic materials such as one or a combination of poly(styrenes), poly(esters), poly(methacrylates), poly(acrylates) and poly(glycols), poly(amides), poly(norbornenes), poly(dienes), poly(alkenes), poly(acrylamides), poly(methacrylamides), poly(vinylethers), poly(vinyl alcohols), poly(ketones), poly(acetals), poly(vinylesters), and poly(carbonates), or other materials that are thermally stable to 300-350° C. but thermally degrade at temperatures above 400° C. Then, the permeable low k dielectric material 22 is deposited (preferably at a temperature not exceeding 350° C.) over the sacrificial layer 23 (307, see FIG. 8) and etched to form the permeable low-K dielectric layer 122 (307, see FIG. 9). The sacrificial layer 23 and the permeable low-K dielectric layer 122 can each be etched to a thickness of approximately 20 nm. The permeable low-K dielectric material 22 may be a material containing silicon (Si), and hydrogen (H), and in some cases may contain oxygen (O), nitrogen (N) and or carbon (C), and should be a material with a free volume or porosity sufficient to allow diffusion of the degradation products of the sacrificial layer. Exemplary permeable low-K dielectric materials 22 include but are not limited to, organosilicate glass, organo silsesquioxanes, hydrido-silsesquioxanes, carbon doped oxides, porous silicon oxides, porous silicon nitrides, porous silicon oxynitrides and siloxanes. The wafer is then heated (e.g., to a temperature above 400° C. for a time period between 1 and 60 minutes) (308, see FIG. 10). The heating temperature and time should be sufficient to thermally degrade the sacrificial layer 23 and to allow the degradation products to volatilize and diffuse through the permeable low-K dielectric layer 122 to form the gap layer 123 adjacent to the gate conductor 10. Then, either an additional dielectric material (e.g., either a nitride layer or an oxide layer) can be deposited over the permeable low-K dielectric layer 122 and any exposed portions of the source/drain extensions 16 and etched to form additional dielectric layer 124, as needed. The sacrificial layer 23, the permeable low-K dielectric material 22, and the additional dielectric material can be deposited by spin-apply, chemical vapor deposition, or other appropriate methods.

Figure 11:
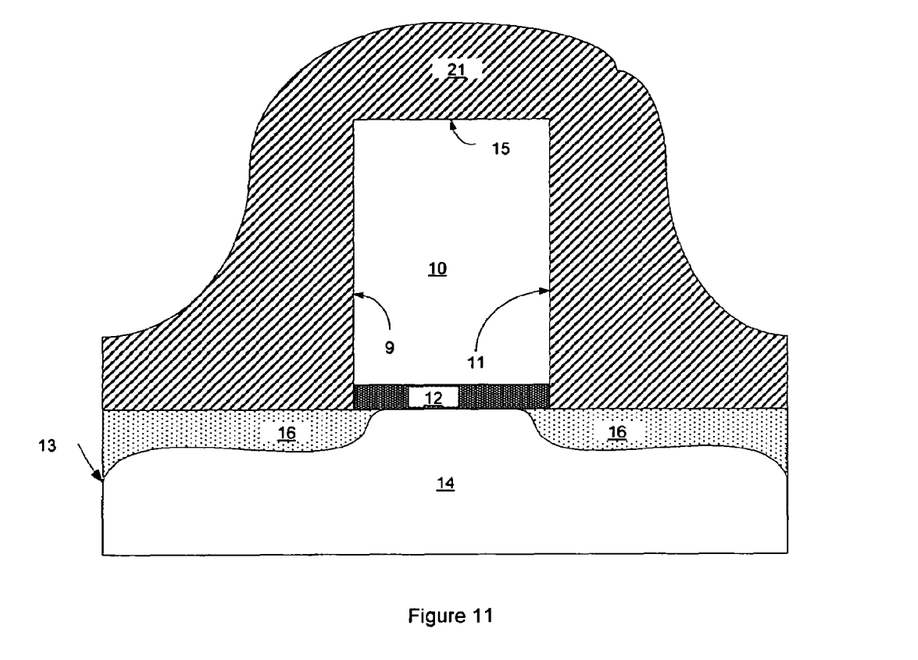
FIG. 11 is a schematic drawing of a partially completed structure of the embodiment of FIG. 2.
Figure 12:
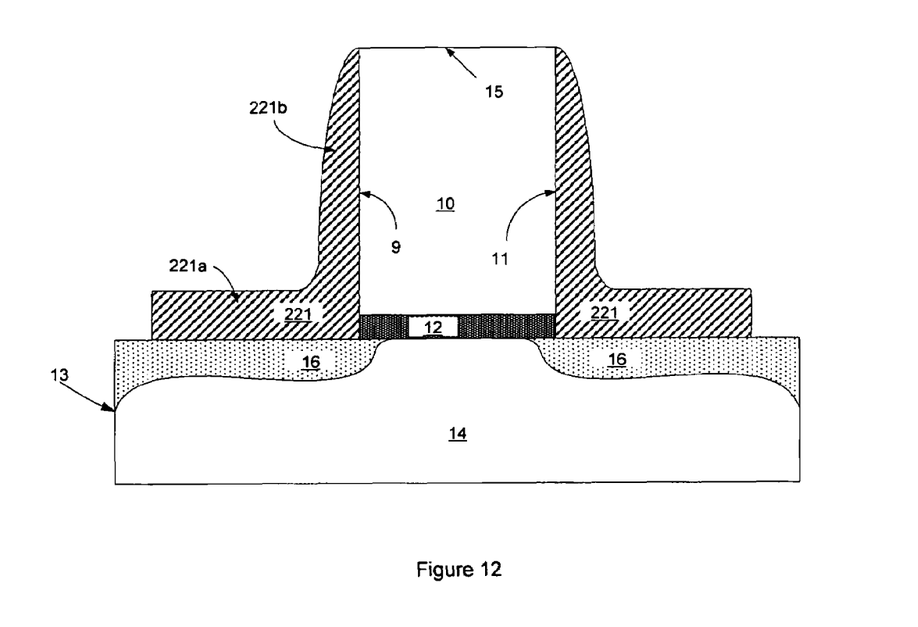
FIG. 12 is a schematic drawing of a partially completed structure of the embodiment of FIG. 3.
Figure 13:
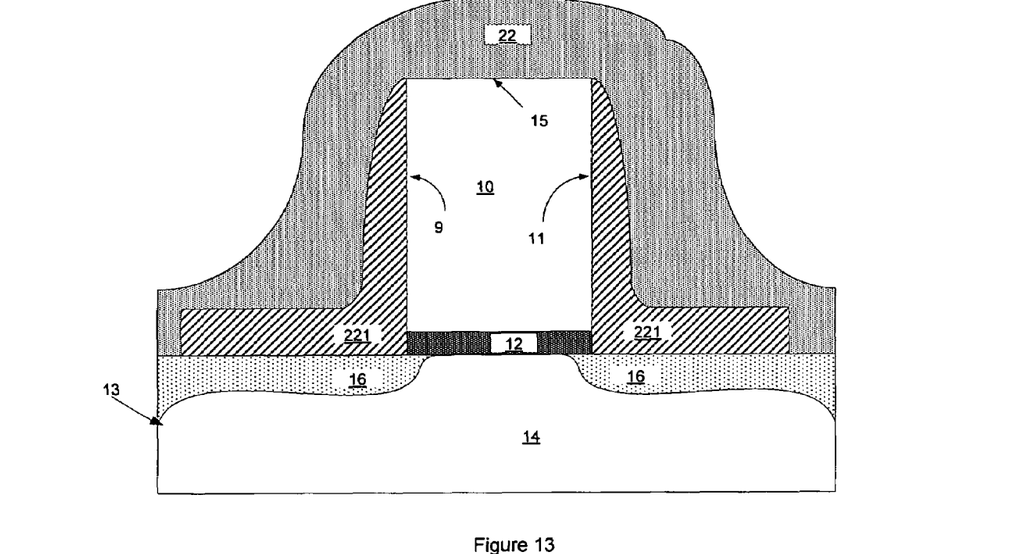
FIG. 13 is a schematic drawing of a partially completed structure of the embodiment of FIG. 2.
Figure 14:
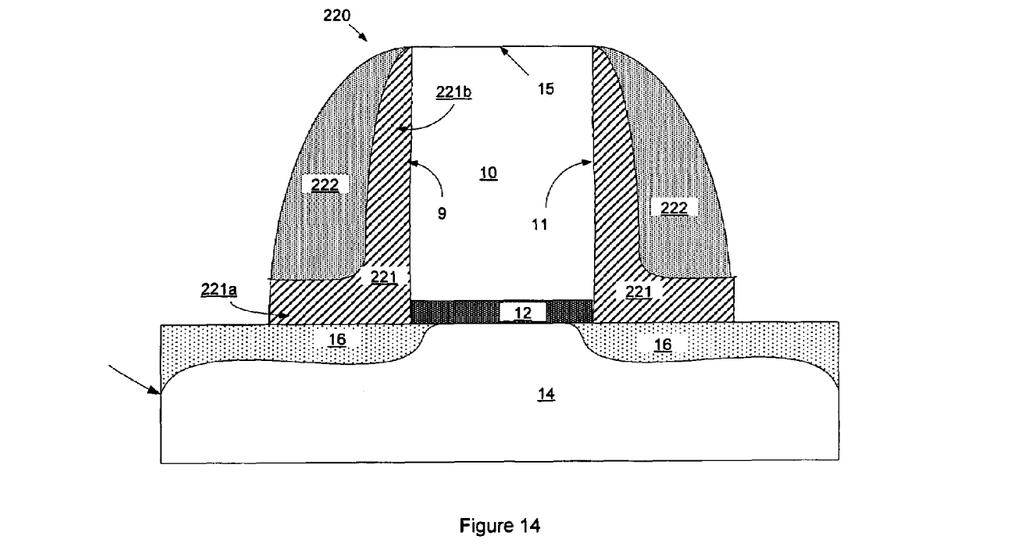
FIG. 14 is a schematic drawing of a partially completed structure of the embodiment of FIG. 3.

Referring to FIG. 3, in an embodiment of the method of forming the structure 200 of FIG. 2, the sidewall spacer 220 is formed such that is comprises an L-shaped first dielectric layer 221, having a permittivity value of less than three. The L-shaped first dielectric layer 221 comprises a vertical portion 221b that is positioned adjacent a corresponding one of the sidewalls 9, 11 of the gate conductor 10. The L-shaped first dielectric layer 221 further comprises a horizontal portion that is positioned above a corresponding one of the source/drain extensions 16 and extends away from the sidewall 9, 11. The spacer 220 also comprises a second dielectric layer 222 that is positioned adjacent the vertical portion 221b and above the horizontal portion 221a of the first dielectric layer 221. To form the each spacer 220 on each of the sidewalls 9, 11 a dielectric material 21 is deposited, e.g., either by a chemical vapor deposition technique or a spin-on technique, over the gate conductor 10 and the source/drain extensions 16 (309, described in greater detail below, see FIG. 11). The dielectric material 21 is etched to form the L-shaped first dielectric layer 221 on either of the sidewalls 9, 11 (309, see FIG. 12). Then, either a nitride (e.g., with a permittivity value of approximately 7.5) or oxide (e.g., with a permittivity value of approximately 3.9) layer 22 is deposited over the first dielectric layer 221 (310, see FIG. 13). The oxide or nitride layer 22 is etched to form the second dielectric layer 222 positioned above the horizontal portion 221a and adjacent the vertical portion 221b of the first dielectric layer 221 (310, see FIG. 14). The second layer 222 protects the ultra-low dielectric first layer 221 from breakdown or erosion during later device fabrication processes. Forming the second dielectric layer 222 using a nitride material, is particularly useful during later fabrication processes (e.g., forming the source and drain regions (414)) because the nitride layer provides good selective etching without much silicon loss. The first and second dielectric layers 221, 222 each can be etched to a thickness of approximately 20 nm.

The low-K material 21 deposited at method process (309) can comprise a material having a permittivity value of less than three. Such materials include, but are not limited to, carbon-doped oxides, hydrogen-doped oxides, aromatic polymers, parylenes, fluorine-doped amorphous carbons, or organosilicates. Alternatively, material 21 comprising a matrix material such as an oxide, a silicate, an organosiliciate, or an organic material, combined with a pore generating material can be deposited over the gate conductor 10. If the deposited material 21 comprises the matrix material and the pore generating material, then after depositing and etching the material 21, the matrix material and the pore generating material are subjected to a rapid thermal anneal process in order to create to degrade the porogen and form pores in the first dielectric layer 121 (see process (422)). Such a porous first dielectric layer 121 can have a permittivity value of less than three and can comprise a porous oxide, a porous silicate, a porous organosilicate, or a porous organic material.

Referring to the structures 100 and 200 of FIGS. 1-2, respectively, in combination with the flow diagram of FIG. 3, each embodiment of the method of forming the field effect transistor structure 100, 200 can further comprise forming an additional dielectric (e.g., oxide or nitride) spacer layer 124, 224 over the permeable low-K layer 122 or the second dielectric layer 222, respectively, as needed (312). After the spacers (120, 220) are formed, additional conventional MOSFET structure fabrication processes can be performed, including but not limited to, implanting the source and drain regions 17 (314), performing a rapid thermal anneal (315), performing a self-aligned silicide process on the source and drain regions 17 and the gate conductor 10 to form silicide contacts 26 (316), depositing an insulator layer 25 over the gate conductor 10, spacer (120, 220, 320) and substrate 13 (318), and etching and filling conductor-filled vias 18 (320).

Figure 15:
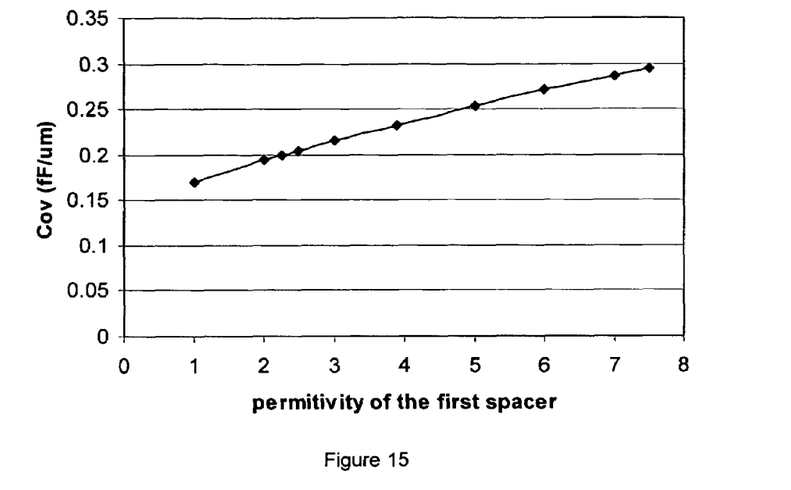
FIG. 15 is graph illustrating simulation results of overlap capacitance relative to spacer permittivity for the embodiment of FIG. 1.
Figure 16:
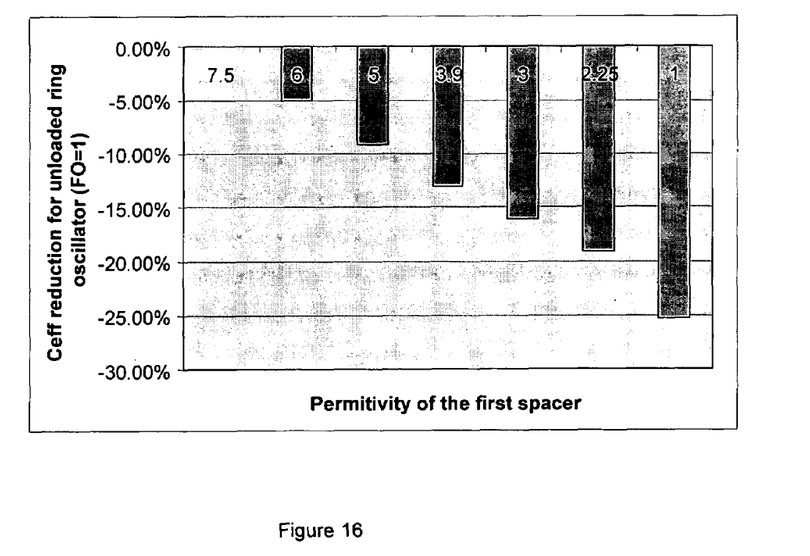
FIG. 16 is a graph illustrating simulation results of the percentage reduction of effective capacitance relative to spacer permittivity for the embodiment of FIG. 1.
Figure 17:
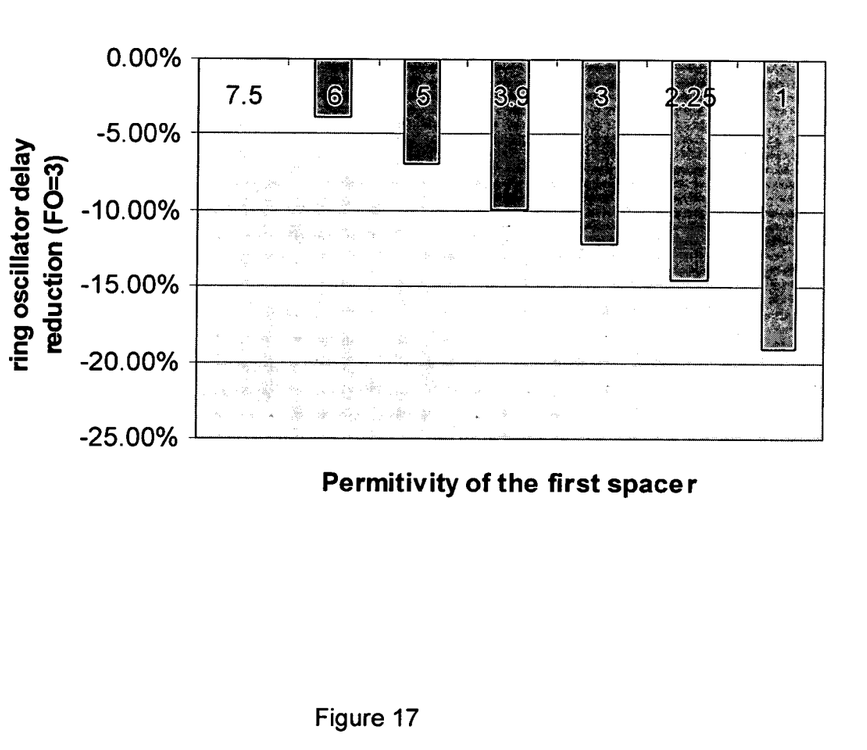
FIG. 17 is a graph illustrating simulation results of the percentage reduction of device delay relative to spacer permittivity for the embodiment of FIG. 1.

Results of simulations performed using the MOSFET device structure 100 of FIG. 1, are illustrated in the graphs of FIGS. 15-17. Specifically, ring oscillation simulations were conducted for the MOSFET device 200, having a spacer 220 comprising a 20 nm thick first dielectric layer 221 and a 20 nm thick nitride second dielectric layer 222.

The simulations were conducted using a first dielectric layer 221 with permittivity values varying between 2 and 7.5. The graph of FIG. 15 illustrates that as the permittivity value of the first dielectric layer 221 of spacer 220 is reduced from 7.5 (e.g., a nitride layer) to 2 (e.g., an ultra-low K vacuum spacer), the parasitic overlap capacitance is reduced from 0.3 fF/um to 0.2 fF/um, amounting to a 33.0% reduction in overlap capacitance. The graph of FIG. 16 illustrates that as the permittivity value of the first dielectric layer 221 of spacer 220 is reduced from 7.5 (e.g., a nitride layer) to 2 (e.g., an ultra-low K spacer), the overall effective capacitance of the invertors for an unloaded ring oscillator with a frequency of oscillation of 1 is reduced up to 25%. The graph of FIG. 17 illustrates that as the overlap capacitance is reduced, the performance of the device 200 improves. For example, as the permittivity value of the first dielectric layer 221 is decreased from 7.5 to 2, the ring oscillator delay of a ring oscillator with a frequency of oscillation of 3 is reduced by 19%.

Therefore, the MOSFET structure and method of fabricating the structure disclosed above incorporate a gate conductor sidewall spacer having a first layer with a low dielectric constant value (i.e., a permittivity value of less than three). The low-K dielectric layer of the sidewall spacer suppresses parasitic overlap capacitance between the gate conductor and the source/drain extensions that extend beneath the gate conductor without degrading drive current and effecting overall MOSFET performance. Reducing the permittivity of gate conductor sidewall spacer to a value of less than three, as disclosed, can reduce the effective capacitance that the device needs to drive by 25% and, thereby, improve performance by up to 19%. The method of fabricating the structure is particularly useful in that it is not complex and is fully compatible with current very large scale integration (VLSI) fabrication technology.

While the invention has been described in terms of embodiments, those skilled in the art will recognize that the invention can be practiced with modification within the spirit and scope of the appended claims.

What is claimed is:

1. A field effect transistor comprising:
   a substrate comprising source/drain extensions positioned laterally adjacent a channel region;
   a gate oxide layer on said channel region and overlapping portions of said source/drain extensions;
   a gate conductor on said gate oxide layer and comprising a sidewall perpendicular to said substrate; and
   a sidewall spacer directly on said substrate positioned laterally adjacent said sidewall and said gate oxide layer, wherein said sidewall spacer comprises:
      a gap on a corresponding one of said source/drain extensions and positioned laterally adjacent said sidewall and said gate oxide layer, wherein said gap comprises a permittivity value of one; and
      a permeable low-K dielectric layer on said corresponding one of said source/drain extensions, positioned laterally adjacent said gap, and further positioned above said gap extending towards said sidewall, wherein said permeable low-K dielectric layer comprises a permittivity value of less than three.

2. The field effect transistor according to claim 1, all the limitations of which are incorporated by reference, wherein said sidewall spacer further comprises another dielectric layer positioned laterally adjacent said permeable low-K dielectric layer and further positioned above said permeable low-K dielectric layer over said gap extending towards said sidewall, wherein said another dielectric layer comprises one of a nitride material and an oxide material.

3. The field effect transistor according to claim 1, all the limitations of which are incorporated by reference, wherein said gap comprises molecules that diffuse through said permeable low-K dielectric layer.

4. The field effect transistor according to claim 3, all the limitations of which are incorporated by reference, wherein said molecules diffuse from an organic material that comprises at least one of a poly(styrene), poly(ester), poly (methacrylate), poly(acrylate), poly(glycol), poly(amide), poly(norbornene), poly(diene), poly(alkene), poly(acrylamide), poly(methacrylamide), poly(vinylether), poly(vinyl alcohol), poly(ketone), poly(acetal), poly(vinylester), and poly(carbonate).

5. The field effect transistor according to claim 3, all the limitations of which are incorporated by reference, wherein said permeable low-K dielectric layer is sufficiently permeable to allow said molecules to diffuse through said permeable low-K dielectric layer in order to form said gap.

6. The field effect transistor according to claim 3, all the limitations of which are incorporated by reference, wherein said permeable low-K dielectric layer comprises one of an organo silicate glass, an organo silsequioxane, a hydridosilsesquioxanes, a porous silicon oxide, a porous silicon nitride, a porous silicon oxynitride, and a siloxane.

7. The field effect transistor according to claim 1, all the limitations of which are incorporated by reference, wherein said gap comprises one of a vacuum, gas and air.

8. A field effect transistor comprising:
   a substrate comprising source/drain extensions positioned laterally adjacent a channel region;
   a gate oxide layer on said channel region and overlapping portions of said source/drain extensions;
   a gate conductor on said gate oxide layer and comprising a sidewall perpendicular to said substrate; and
   a sidewall spacer directly on said substrate positioned laterally adjacent said sidewall and said gate oxide layer, wherein said sidewall spacer comprises:
      a gap on a corresponding one of said source/drain extensions and positioned laterally adjacent said sidewall and said gate oxide layer, wherein said gap comprises a permittivity value of one and wherein said gap further comprises one of a vacuum and gas; and
      a permeable low-K dielectric layer on said corresponding one of said source/drain extensions, positioned laterally adjacent said gap, and further positioned above said gap extending towards said sidewall, wherein said permeable low-K dielectric layer comprises a permittivity value of less than three.

9. The field effect transistor according to claim 8, all the limitations of which are incorporated by reference, wherein said sidewall spacer further comprises another dielectric layer positioned laterally adjacent said permeable low-K dielectric layer and further positioned above said permeable low-K dielectric layer over said gap extending towards said sidewall, wherein said another dielectric layer comprises one of a nitride material and an oxide material.

10. The field effect transistor according to claim 8, all the limitations of which are incorporated by reference, wherein said gap comprises molecules that diffuse through said permeable low-K dielectric layer.

11. The field effect transistor according to claim 10, all the limitations of which are incorporated by reference, wherein said molecules diffuse from an organic material that comprises at least one of a poly(styrene), poly(ester), poly (methacrylate), poly(acrylate), poly(glycol), poly(amide), poly(norbornene), poly(diene), poly(alkene), poly(acrylamide), poly(methacrylamide), poly(vinylether), poly(vinyl alcohol), poly(ketone), poly(acetal), poly(vinylester), and poly(carbonate).

12. The field effect transistor according to claim 10, all the limitations of which are incorporated by reference, wherein said permeable low-K dielectric layer is sufficiently permeable to allow said molecules to diffuse through said permeable low-K dielectric layer in order to form said gap.

13. The field effect transistor according to claim 10, all the limitations of which are incorporated by reference, wherein said permeable low-K dielectric layer comprises one of an organo silicate glass, an organo silsequioxane, a hydridosilsesquioxanes, a porous silicon oxide, a porous silicon nitride, a porous silicon oxynitride, and a siloxane.

14. A field effect transistor comprising:
  a substrate comprising source/drain extensions positioned laterally adjacent a channel region;
  a gate oxide layer on said channel region and overlapping portions of said source/drain extensions;
  a gate conductor on said gate oxide layer and comprising a sidewall perpendicular to said substrate; and
  a sidewall spacer directly on said substrate positioned laterally adjacent said sidewall and said gate oxide layer, wherein said sidewall spacer comprises:
    a gap on a corresponding one of said source/drain extensions and positioned laterally adjacent said sidewall and said gate oxide layer, wherein said gap comprises a permittivity value of one;
    a permeable low-K dielectric layer on said corresponding one of said source/drain extensions, positioned laterally adjacent said gap, and further positioned above said gap extending towards said sidewall, wherein said permeable low-K dielectric layer comprises a permittivity value of less than three; and
    one of a nitride layer and an oxide layer on said substrate positioned laterally adjacent said permeable low-K dielectric layer and further positioned above said permeable low-K dielectric layer over said gap so as to provide structural integrity to said sidewall spacer.

15. The field effect transistor according to claim 14, all the limitations of which are incorporated by reference, wherein said gap comprises molecules that diffuse through said permeable low-K dielectric layer.

16. The field effect transistor according to claim 15, all the limitations of which are incorporated by reference, wherein said molecules diffuse from an organic material that comprises at least one of a poly(styrene), poly(ester), poly (methacrylate), poly(acrylate), poly(glycol), poly(amide), poly(norbornene), poly(diene), poly(alkene), poly(acrylamide), poly(methacrylamide), poly(vinylether), poly(vinyl alcohol), poly(ketone), poly(acetal), poly(vinylester), and poly(carbonate).

17. The field effect transistor according to claim 14, all the limitations of which are incorporated by reference, wherein said permeable low-K dielectric layer is sufficiently permeable to allow said molecules to diffuse through said permeable low-K dielectric layer in order to form said gap.

18. The field effect transistor according to claim 14, all the limitations of which are incorporated by reference, wherein said permeable low-K dielectric layer comprises one of an organo silicate glass, an organo silsequioxane, a hydridosilsesquioxanes, a porous silicon oxide, a porous silicon nitride, a porous silicon oxynitride, and a siloxane.

19. The field effect transistor according to claim 14, all the limitations of which are incorporated by reference, wherein said gap comprises one of a vacuum, gas and air.

* * * * *